(12) United States Patent
Congdon

(10) Patent No.: US 6,259,292 B1
(45) Date of Patent: Jul. 10, 2001

(54) THREE-TERMINAL INVERTING HYSTERETIC TRANSISTOR SWITCH

(76) Inventor: James S. Congdon, P.O. Box 617, Sudbury, MA (US) 01776

( * ) Notice: Subject to any disclaimer, the term of this patent is extended or adjusted under 35 U.S.C. 154(b) by 0 days.

(21) Appl. No.: 09/295,931

(22) Filed: Apr. 21, 1999

(51) Int. Cl.[7] ...................................................... H03K 3/12
(52) U.S. Cl. ........................ 327/206; 327/427; 327/483; 323/282
(58) Field of Search .................................... 327/199, 200, 327/205, 206, 207–212, 419, 427, 430, 434, 108–112, 347–377, 483; 326/26–28, 82–91; 307/98, 99; 323/311, 317, 349, 351, 265, 282

(56) References Cited

U.S. PATENT DOCUMENTS

| | | | |
|---|---|---|---|
| 5,134,323 | 7/1992 | Congdon | 327/430 |
| 5,334,882 | * 8/1994 | Ting | 327/108 |
| 5,519,341 | * 5/1996 | Corsi et al. | 327/80 |
| 5,563,759 | * 10/1996 | Nadd | 361/101 |
| 5,952,870 | 9/1999 | Urban | 327/404 |

* cited by examiner

Primary Examiner—Timothy P. Callahan
Assistant Examiner—Minh Nguyen
(74) Attorney, Agent, or Firm—Kriegsman & Kriegsman

(57) ABSTRACT

An inverting hysteretic transistor switch having an input terminal, an output terminal and a ground terminal includes, in some embodiments, a metal-oxide semiconductor field effect transistor (MOSFET) having an on switching state and an off switching state. The MOSFET includes a drain terminal connected to the output terminal, a gate terminal and a source terminal connected to the ground terminal. The switch further includes a hysteresis circuit connected to the input terminal and to the gate terminal of the MOSFET. In use, with an input voltage having low-to-high and high-to-low input voltage transitions applied to the input terminal, the hysteresis circuit switches the MOSFET to its on switching state at a first threshold voltage during low-to-high input voltage transitions. In addition, the hyteresis circuit switches the MOSFET to its off switching state at a second threshold voltage, which is less than the first threshold voltage, during high-to-low input voltage transitions.

12 Claims, 8 Drawing Sheets

| $V_{in}$ | SWITCHING STATE FOR $Q_1$ | SWITCHING STATE FOR $Q_2$ | SWITCHING STATE FOR $Q_3$ |
|---|---|---|---|
| 0 Volts Rising | OFF | OFF | OFF |
| 1 Volt Rising | OFF | OFF | OFF |
| 2 Volts Rising | OFF | ON | OFF |
| 3 Volts Rising | ON | ON | ON |
| 3 Volts Falling | ON | OFF | ON |
| 2 Volts Falling | ON | OFF | ON |
| 1 Volt Falling | OFF | ON | OFF |
| 0 Volts Falling | OFF | OFF | OFF |

*FIG. 3*

| $V_{in}$ | SWITCHING STATE FOR $Q_1$ | SWITCHING STATE FOR $Q_2$ | SWITCHING STATE FOR $Q_3$ |
|---|---|---|---|
| 0 Volts Rising | OFF | OFF | OFF |
| 0.8 Volts Rising | OFF | ON | OFF |
| 0.9 Volts Rising | OFF | ON | OFF |
| 1.0 Volt Rising | ON | OFF | ON |
| 1.0 Volt Falling | ON | OFF | ON |
| 0.9 Volts Falling | ON | OFF | ON |
| 0.8 Volts Falling | OFF | ON | OFF |
| 0 Volts Falling | OFF | OFF | OFF |

*FIG. 5*

THREE-TERMINAL INVERTING HYSTERETIC TRANSISTOR SWITCH

BACKGROUND OF THE INVENTION

The present invention relates generally to transistor switches and, more particularly, to inverting transistor switches.

Transistor switches, or transistors, are well known in the art and are commonly used. Transistors are solid-state electronic devices which are capable of amplification and switching.

Inverting transistors are well known in the art and are commonly used to invert an input signal. Inverting transistors, such as bipolar transistors and metal-oxide semiconductor field effect transistors (MOSFETs), typically contain only three terminals. Specifically, inverting transistors contain an input terminal, an output terminal which is used to connect the transistor to a load and a ground terminal. Contrary to the configuration of noninverting transistors, inverting transistors do not require a fourth terminal connected to a power supply, thereby rendering inverting transistors more desirable than noninverting transistors.

In U.S. Pat. No. 5,134,323 to J. S. Congdon, there is disclosed a noninverting transistor switch having only three terminals. In one embodiment, the three terminal noninverting transistor switch includes first, second and third terminals, a depletion mode field effect transistor (FET) having drain and source electrodes that define a current path in the transistor and are connected to the third and second terminals respectively and a gate electrode for controlling the current flow in the transistor current path. A negative voltage converter having an input electrode, an output electrode and a return electrode has its output electrode coupled to the gate electrode in the FET, its return electrode coupled to the source electrode and its input electrode coupled to the first terminal. In operation, the current flow between the drain and source electrodes will be high when a low signal is applied to the input electrode with respect to the source electrode and will be lower when a higher signal is applied to the input electrode with respect to the source electrode. In another embodiment, the noninverting switch having only three terminals includes first, second and third transistors, wherein the third transistor is coupled through circuitry to the first terminal of the noninverting transistor switch to provide a controlled amount of positive feedback which results in hysteresis or "Schmitt-trigger" like variation of the first terminal input threshold voltage.

Three terminal inverting transistors typically experience a notable drawback. Specifically, a noisy input signal which approaches the threshold voltage for a three terminal inverting transistor can often cause the transistor to experience unwanted state changes or even to remain in between an on switching state and an off switching state, this in-between condition being prone to oscillation and high power dissipation.

Accordingly, switching devices which experience hysteresis are desirable. Hysteretic switches reduce the problem of a noisy input signal causing the switching device to experience unwanted state conditions by using two different threshold voltages. Switching devices which experience hysteresis typically use a high threshold voltage, commonly referred to as the rising or positive threshold voltage, to switch the device during low-to-high input signal transitions and a lower threshold voltage, commonly referred to as the falling or negative threshold voltage, to switch the device during high-to-low input signal transitions.

Schmitt triggers are one well-known type of hysteretic switching device. A Schmitt trigger is a form of a bistable multivibrator and is often used in applications where square waves with a constant amplitude are needed or where sine waves require conversion to square waves. Due to its hysteretic properties, Schmitt triggers are effectively immune to a noisy input signal as long as the peak-to-peak amplitude of the input noise signal is less than the difference between the rising and falling threshold voltages for the device.

In use, a Schmitt trigger functions in the following manner. The Schmitt trigger output voltage remains low until the input signal voltage crosses the rising threshold voltage for the device. Once the input signal voltage crosses the rising threshold voltage for the device, the Schmitt trigger is actuated and the output voltage abruptly rises. Once the input signal voltage falls below the falling threshold voltage for the device, the Schmitt trigger produces an output voltage which drops to a low voltage state almost instantly.

Schmitt triggers are undesirable because the device requires four terminals as opposed to inverting transistors which require only three terminals. In addition to an input terminal, an output terminal and a ground terminal, Schmitt triggers require a power supply terminal, which is undesirable.

Silicon controlled rectifiers (SCR) are four-layer unidirectional devices for bistable switching. A silicon controlled rectifier is essentially a rectifier diode which additionally comprises a control element.

It should be noted that silicon controlled rectifiers are inverting, experience hysteresis and comprise only three terminals, which is desirable.

However, silicon controlled rectifiers experience a notable drawback. Specifically, silicon controlled rectifiers experience output signal actuated hysteresis, which is less desirable than switching devices which experience input signal actuated hysteresis, such as Schmitt triggers. In particular, silicon controlled rectifiers experience output current actuated hysteresis which is load dependent, and therefore highly undesirable.

In use, a silicon controlled rectifier functions in the following manner. The silicon controlled rectifier remains off until the input signal voltage crosses the rising threshold for the device. Once the input signal voltage crosses the rising threshold voltage for the device, the silicon controlled rectifier is actuated and the output current abruptly rises. However, when the input signal voltage falls even below ground, the silicon controlled rectifier does not experience a drop to zero in output current. Unlike the Schmitt trigger, the silicon controlled rectifier can not be said to have a falling input threshold voltage. To the contrary, during turn-off, silicon controlled rectifiers are output signal dependent because the output current must be brought nearly to zero for the silicon controlled rectifier to turn off.

Electromechanical relay circuits are electromechanical coil and contact devices which control power distributed to a load by energizing an isolated input circuit. Electromechanical relay circuits can be built using electrically isolated input and output circuits. In use, an input signal energizes an electromagnet that attracts a hinged and spring-loaded element commonly referred to as an armature. Output contacts, attached to but insulated from the armature, are opened or closed by the movement of the armature. In the closed position, the contacts apply power to the load. In the open position, the contacts remove power to the load.

It should be noted that electromechanical relay circuits can be connected to be inverting, experience input signal actuated hysteresis and comprise only three terminals, which is highly desirable.

However, inverting electromechanical relay circuits experience a number of alternative drawbacks. Specifically, electromechanical relay circuits require a large amount of input power, are large, are slow and are unreliable, which is highly undesirable.

SUMMARY OF THE INVENTION

It is an object of the present invention to provide a new and improved transistor switch.

It is another object of the present invention to provide a transistor switch that is inverting.

It is yet another object of the present invention to provide a transistor switch as described above which contains only three terminals.

It is still another object of the present invention to provide a transistor switch as described above which experiences hysteresis.

It is a further object of the present invention to provide a transistor switch as described above which experiences input signal actuated hysteresis.

It is yet another object of the present invention to provide an electric switch as described above which can be mass produced, has a minimal number of parts, is limited in size, operates quickly, is reliable, requires a limited amount of input power and can be very easily used.

Accordingly, there is provided an inverting hysteretic transistor switch having only three terminals, said three terminals being an input terminal, an output terminal and a ground terminal, an input voltage being applied to said input terminal, said input voltage having low-to-high input voltage transitions and high-to-low input voltage transitions, said inverting hysteretic transistor switch comprising a transistor having a first terminal, a second terminal and a third terminal, the first terminal being connected to the output terminal and the second terminal being connected to the ground terminal, said transistor having an on switching state and an off switching state, a hysteresis circuit connected to the input terminal, said hysteresis circuit switching said transistor to its on switching state at a first threshold voltage during low-to-high input voltage transitions and said hysteresis circuit switching said transistor to its off switching state at a second threshold voltage during high-to-low input voltage transitions, the first threshold voltage being greater than the second threshold voltage.

Additional objects, as well as features and advantages, of the present invention will be set forth in part in the description which follows, and in part will be obvious from the description or may be learned by practice of the invention. In the description, reference is made to the accompanying drawings which form a part thereof and in which is shown by way of illustration particular embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

The accompanying drawings, which are hereby incorporated into and constitute a part of this specification, illustrate particular embodiments of the invention and, together with the description, serve to explain the principles of the invention. In the drawings wherein like reference numerals represent like parts:

FIG. 3 is a chart useful in understanding the operation of the three-terminal inverting hysteretic transistor switch shown in FIG. 1;

FIG. 5 is a chart useful in understanding the operation of the three-terminal inverting hysteretic transistor switch shown in FIG. 4;

DETAILED DESCRIPTION OF A PREFERRED EMBODIMENT

Figure 1:
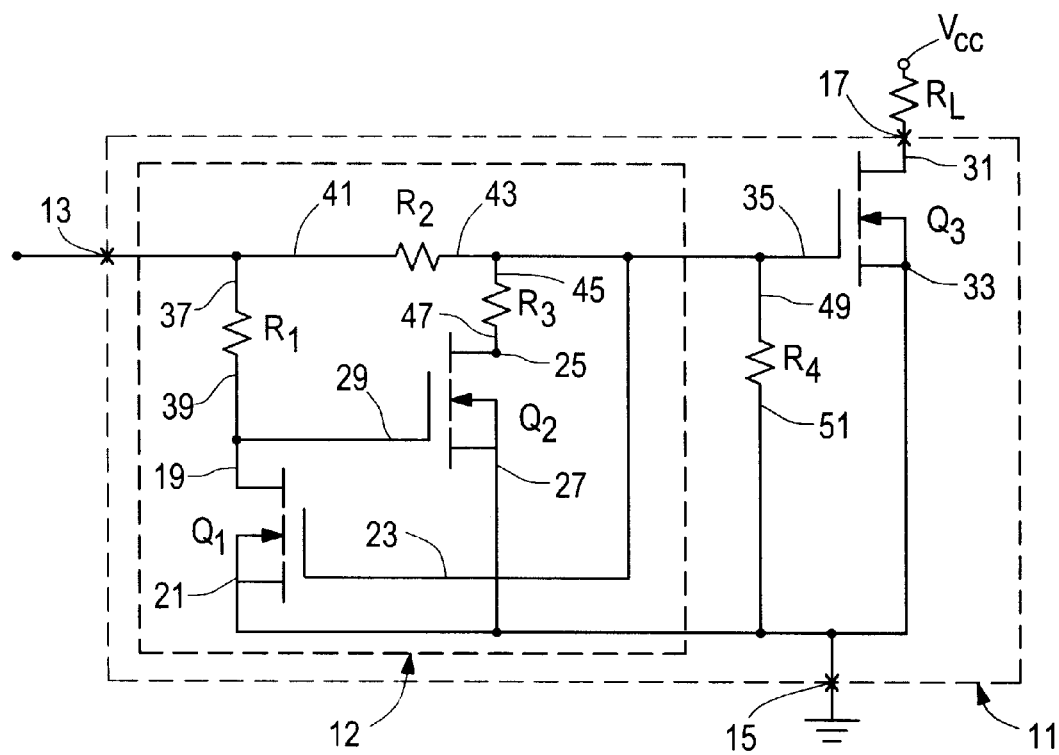
FIG. 1 is a schematic representation of a first embodiment of a three-terminal inverting hysteretic transistor switch constructed according to the teachings of the present invention, the switch being shown with an external load.

Referring now to FIG. 1, there is shown a first embodiment of a three-terminal inverting hysteretic transistor switch constructed according to the teachings of the present invention, the switch being represented generally by reference numeral 11. As will be described further in detail below, switch 11 is inverting, experiences input signal actuated hysteresis and comprises only three terminals.

Switch 11 comprises an input terminal 13, a ground terminal 15 and an output terminal 17. As can be appreciated, input terminal 13, ground terminal 15 and output terminal 17 are the only terminals for switch 11, which is an object of the present invention.

Switch 11 also comprises a first MOSFET $Q_1$, a second MOSFET $Q_2$ and a third MOSFET $Q_3$. First MOSFET $Q_1$, second MOSFET $Q_2$ and third MOSFET $Q_3$ are identical. Specifically, first MOSFET $Q_1$, second MOSFET $Q_2$ and third MOSFET $Q_3$ are all preferably N-channel, enhancement-mode, VN2222LL-model MOSFETs, each preferably having a MOSFET threshold voltage $V_{FETTH}$ of approximately 1.2 volts. However, it is to be understood that first MOSFET $Q_1$, second MOSFET $Q_2$ and third MOSFET $Q_3$ are not limited to having a threshold voltage of approximately 1.2 volts. In addition, it is to be understood that first MOSFET $Q_1$, second MOSFET $Q_2$ and third MOSFET $Q_3$ are not limited to having equal threshold voltages. Rather, it is to be understood that first MOSFET $Q_1$, second MOSFET $Q_2$ and third MOSFET $Q_3$ could each have different threshold voltage values from one another without departing from the spirit of the present invention.

First MOSFET $Q_1$ includes a drain electrode 19, a source electrode 21 connected to ground terminal 15 and a gate electrode 23. Second MOSFET $Q_2$ includes a drain electrode 25, a source electrode 27 connected to ground terminal 15 and a gate electrode 29 connected to drain electrode 19 of first MOSFET $Q_1$. Third MOSFET $Q_3$ includes a drain electrode 31 connected to output terminal 17, a source electrode 33 connected to ground terminal 15 and a gate electrode 35 connected to gate electrode 23 of first MOSFET $Q_1$.

Switch 11 further comprises a first resistor $R_1$, a second resistor $R_2$ and a third resistor $R_3$. First resistor $R_1$ preferably has a value of approximately 120 Kohms and includes a first terminal 37 connected to input terminal 13 and a second terminal 39 connected to drain electrode 19 of first MOSFET $Q_1$. Second resistor $R_2$ preferably has a value of approximately 120 Kohms and includes a first terminal 41 connected to input terminal 13 and a second terminal 43 connected to gate electrode 23 of first MOSFET $Q_1$. Third resistor $R_3$ preferably has a value of approximately 120 Kohms and includes a first terminal 45 connected to gate electrode 23 of first MOSFET $Q_1$ and a second terminal 47 connected to drain electrode 25 of second MOSFET $Q_2$.

Switch 11 additionally comprises a fourth resistor $R_4$. Fourth resistor $R_4$ preferably has a value of approximately 1.0 Mohms and includes a first terminal 49 connected to gate electrode 23 of first MOSFET $Q_1$ and a second terminal 51 connected to ground terminal 15. It should be noted that fourth resistor $R_4$ is required because first MOSFET $Q_1$, second MOSFET $Q_2$ and third MOSFET $Q_3$ are identical. However, if first MOSFET $Q_1$, second MOSFET $Q_2$ and third MOSFET $Q_3$ had unequal threshold voltage values which would result in second MOSFET $Q_2$ turning on at a lower input voltage than first MOSFET $Q_1$ and third MOSFET $Q_3$ during use, fourth resistor $R_4$ could be eliminated from switch 11 without departing from the spirit of the present invention.

Output terminal 17 can be connected through a load resistor $R_L$ to a supply voltage $V_{cc}$, load resistor $R_L$ preferably having a value of 1.0 Kohms. As can be appreciated, both load resistor $R_L$ and supply voltage $V_{cc}$ are external to switch 11 and consequently are not to be considered part of the present invention.

It should be noted that an additional device, such as a diode, PNP bipolar transistor, P-channel FET, or programmable unijunction transistor (PUT), could optionally be connected to input terminal 13 and gate electrode 35 in parallel with second resistor $R_2$ without departing from the spirit of the present invention. As can be appreciated, the device would serve to assist in removing charge from gate electrode 35 of third MOSFET $Q_3$.

Together, first MOSFET $Q_1$, second MOSFET $Q_2$, first resistor $R_1$, second resistor $R_2$ and third resistor $R_3$ form a hysteresis circuit 12 for third MOSFET $Q_3$. Specifically, third MOSFET $Q_3$ acts as the output switch for switch 11. Hysteresis circuit 12 provides a high threshold voltage to gate electrode 35, commonly referred to as the rising or positive threshold voltage, to switch third MOSFET $Q_3$ on during low-to-high input signal transitions and a lower threshold voltage to gate electrode 35, commonly referred to as the falling or negative threshold voltage, to switch third MOSFET $Q_3$ off during high-to-low input signal transitions, as will be described in detail below.

Figure 2:
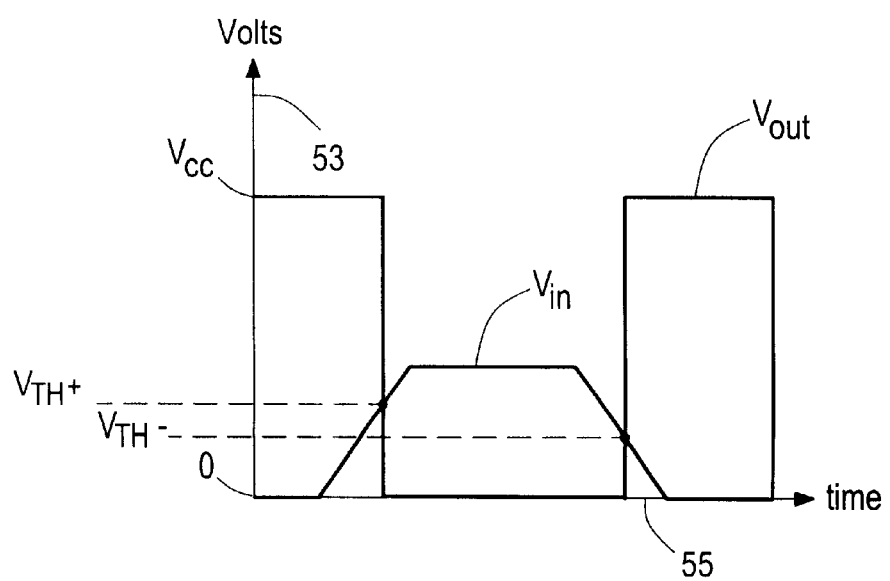
FIG. 2 is a graphical representation comparing an input voltage signal with an output voltage signal for the three-terminal inverting hysteretic transistor switch shown in FIG. 1.

In use, switch 11 functions in the following manner. FIG. 2 represents a graphical representation comparing an input voltage signal $V_{in}$ with an output voltage signal $V_{out}$ for switch 11, the graphical representation having a vertical axis 53 representing voltage and a horizontal axis 55 representing time. FIG. 3 represents a chart showing the switching state of first, second and third MOSFETs $Q_1$, $Q_2$ and $Q_3$ at selected points for input voltage signal $V_{in}$. Referring to FIGS. 1–3, with input voltage $V_{in}$ representing a trapezoidal wave and with the time at zero, input voltage $V_{in}$ is at zero. With input voltage $V_{in}$ at zero, first MOSFET $Q_1$, second MOSFET $Q_2$ and third MOSFET $Q_3$ are all off. With third MOSFET $Q_3$ off, no current passes through load resistor $R_L$. As a result, output voltage $V_{out}$ at output terminal 17 will be approximately $V_{cc}$, discarding any leakage.

As input voltage $V_{in}$ is slowly increased, once input voltage $V_{in}$ equals 1.0×MOSFET threshold voltage $V_{FETTH}$ (approximately 1.2 volts), second MOSFET $Q_2$ will turn on because, with virtually no current in first resistor $R_1$, the voltage at gate electrode 29 of second MOSFET $Q_2$ is approximately the value of input voltage $V_{in}$. Once input voltage $V_{in}$ equals MOSFET threshold voltage $V_{FETTH}$, second MOSFET $Q_2$ will have the value of MOSFET threshold voltage $V_{FETTH}$ at gate electrode 29 and, as a consequence, second MOSFET $Q_2$ will turn on, with first MOSFET $Q_1$ and third MOSFET $Q_3$ remaining off. Once second MOSFET $Q_2$ turns on, current will flow through second resistor $R_2$ and third resistor $R_3$. Second resistor $R_2$ and third resistor $R_3$ together act as voltage dividers. As a result, voltage at the junction of second resistor $R_2$ and third resistor $R_3$ will then pass into gate electrodes 23 and 35 of first and third MOSFETs $Q_1$ and $Q_3$, respectively, with gate electrode 35 of third MOSFET $Q_3$ receiving approximately ½ of input voltage $V_{in}$ and gate electrode 23 of first MOSFET $Q_1$ also receiving approximately ½ of input voltage $V_{in}$.

As input voltage $V_{in}$ increases, eventually first and third MOSFETs $Q_1$ and $Q_3$ will turn on once input voltage $V_{in}$ equals approximately 2.1×MOSFET threshold voltage $V_{FETTH}$ (approximately 2.5 volts), this value of $V_{in}$ being identified as the rising threshold voltage $V_{TH+}$ for switch 11 in FIG. 2. When first MOSFET $Q_1$ turns on, first MOSFET $Q_1$ pulls down the voltage at gate electrode 29 of second MOSFET $Q_2$ until second MOSFET $Q_2$ turns off. With second MOSFET $Q_2$ off, no current flows through third resistor $R_3$. As a consequence, the voltage at gate electrode 35 of third MOSFET $Q_3$ will rise from approximately 1.0×MOSFET threshold voltage $V_{FETTH}$ to approximately 1.9×MOSFET threshold voltage $V_{FETTH}$. As a result, switch 11 abruptly turns on, thereby causing rising threshold hysteresis for switch 11 which causes output voltage $V_{out}$ to drop to approximately zero volts, as shown in FIG. 2.

As input voltage $V_{in}$ begins to drop at the tail end of the trapezoidal waveform, third MOSFET $Q_3$ will turn off once input voltage $V_{in}$ equals approximately 1.1×MOSFET threshold voltage $V_{FETTH}$ (approximately 1.3 volts), this value of $V_{in}$ being identified as the falling threshold voltage $V_{TH-}$ for switch 11 in FIG. 2. Specifically, due to the specific values of second resistor $R_2$ and fourth resistor $R_4$, once input voltage $V_{in}$ equals approximately 1.1×MOSFET threshold voltage $V_{FETTH}$, gate electrode 35 at third MOSFET $Q_3$ has a voltage of approximately MOSFET threshold voltage $V_{FETTH}$. Similarly, once input voltage $V_{in}$ drops below approximately 1.1×MOSFET threshold voltage $V_{FETTH}$, first MOSFET $Q_3$ will turn off. Once first MOSFET $Q_1$ turns off, second MOSFET $Q_2$ will turn back on. With second MOSFET $Q_2$ back on, the voltage at gate electrode 35 of third MOSFET $Q_3$ will lower, thereby making first and third MOSFETs $Q_1$ and $Q_3$ turn off. Once first and third MOSFETs $Q_1$ and $Q_3$ turn off, output voltage $V_{out}$ at output terminal 17 will abruptly return to approximately $V_{cc}$, as shown in FIG. 2, discarding any leakage.

It should be noted that rising threshold voltage $V_{TH+}$ (approximately 2.5 volts) is significantly higher than the falling threshold voltage $V_{TH-}$ (approximately 1.3 volts), as shown in FIG. 2. As a result, a noisy input voltage signal $V_{in}$ will not cause switch 11 to experience unwanted state changes, which is desirable.

Figure 4:
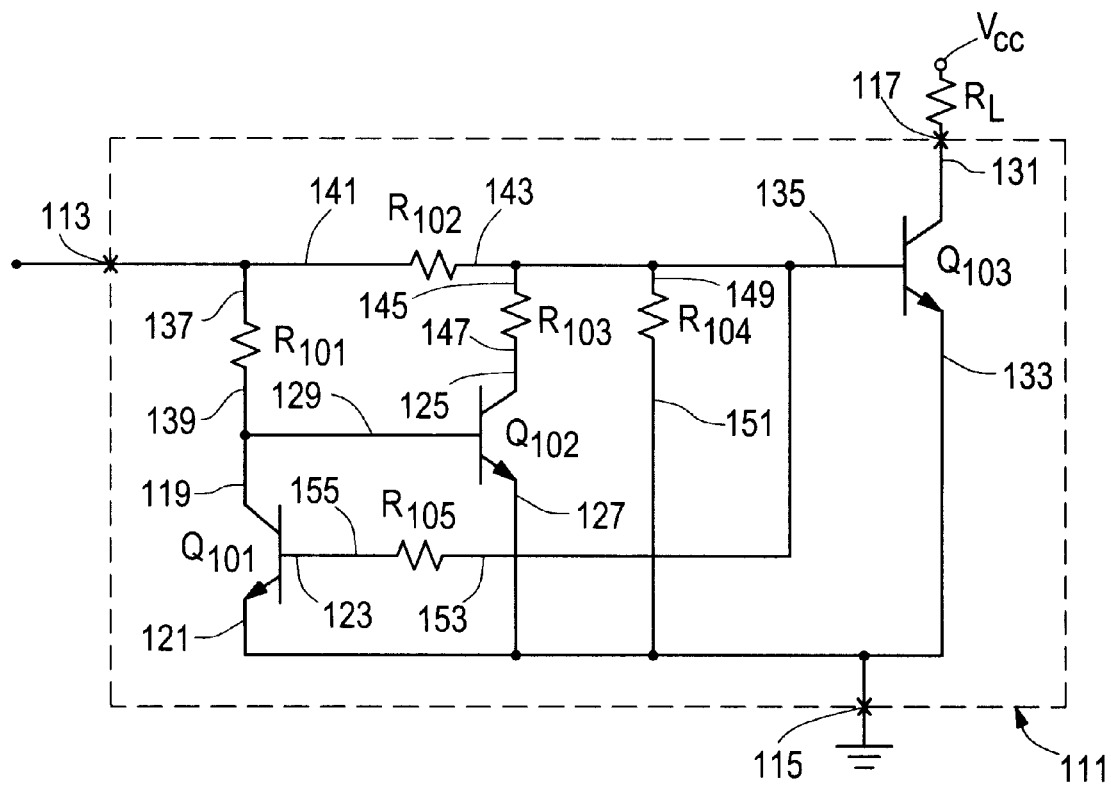
FIG. 4 is a schematic representation of a second embodiment of a three-terminal inverting hysteretic transistor switch constructed according to the teachings of the present invention, the switch being shown with an external load.

Referring now to FIG. 4, there is shown a second embodiment of a three-terminal inverting hysteretic transistor switch constructed according to the teachings of the present invention, the switch being identified as reference numeral 111. Switch 111 is similar to switch 11 in that switch 111 is also inverting, experiences input signal actuated hysteresis and comprises only three terminals.

The principle distinction between switch 111 and switch 11 is that switch 111 comprises a first bipolar junction transistor (BJT) $Q_{101}$, a second bipolar junction transistor (BJT) $Q_{102}$ and a third bipolar junction transistor (BJT) $Q_{103}$ in place of first MOSFET $Q_1$, second MOSFET $Q_2$ and third MOSFET $Q_3$, respectively, of switch 11. In use, switch 11 and switch 111 function in a similar manner.

It should be noted that although switch 11 is shown comprising three MOSFETs and switch 111 is shown comprising three bipolar junction transistors, additional switch embodiments which comprise combinations of MOSFETs and bipolar junction transistors could readily be manufactured without departing from the spirit of the present invention.

Switch 111 comprises an input terminal 113, a ground terminal 115 and an output terminal 117. As can be appreciated, input terminal 113, ground terminal 115 and output terminal 117 are the only terminals for switch 111, which is an object of the present invention.

First bipolar junction transistor (BJT) $Q_{101}$, second bipolar junction transistor (BJT) $Q_{102}$ and third bipolar junction transistor (BJT) $Q_{103}$ are identical. Specifically, first bipolar junction transistor (BJT) $Q_{101}$, second bipolar junction transistor (BJT) $Q_{102}$ and third bipolar junction transistor (BJT) $Q_{103}$ are all preferably NPN 2N2222-type bipolar junction transistors, each preferably having a BJT threshold voltage $V_{BJTTH}$ of approximately 0.7 volts. However, it is to be understood that first BJT $Q_{101}$, second BJT $Q_{102}$ and third BJT $Q_{103}$ are not limited to having a threshold voltage of approximately 0.7 volts. In addition, it is to be understood that first BJT $Q_{101}$, second BJT $Q_{102}$ and third BJT $Q_{103}$ are not limited to having equal threshold voltages. Rather, it is to be understood that first BJT $Q_{101}$, second BJT $Q_{102}$ and third BJT $Q_{103}$ could each have different threshold voltage values from one another without departing from the spirit of the present invention.

First BJT $Q_{101}$ includes a collector electrode 119, an emitter electrode 121 connected to ground terminal 115 and a base electrode 123. Second BJT $Q_{102}$ includes a collector electrode 125, an emitter electrode 127 connected to ground terminal 115 and a base electrode 129 connected collector electrode 119 of first BJT $Q_{101}$. Third BJT $Q_{103}$ includes a collector electrode 131 connected to output terminal 117, an emitter electrode 133 connected to ground terminal 115 and a base electrode 135.

Switch 111 further comprises a first resistor $R_{101}$, a second resistor $R_{102}$ and a third resistor $R_{103}$. First resistor $R_{101}$ preferably has a value of approximately 1.0 Mohms and includes a first terminal 137 connected to input terminal 113 and a second terminal 139 connected to collector electrode 119 of first BJT $Q_{101}$. Second resistor $R_{102}$ preferably has a value of approximately 22 Kohms and includes a first terminal 141 connected to input terminal 113 and a second terminal 143 connected to base electrode 135 of third BJT $Q_{103}$. Third resistor $R_{103}$ preferably has a value of approximately 120 Kohms and includes a first terminal 145 connected to base electrode 135 of third BJT $Q_{103}$ and a second terminal 147 connected to collector electrode 125 of second BJT $Q_{102}$.

Switch 111 additionally comprises a fourth resistor $R_{104}$. Fourth resistor $R_{104}$ preferably has a value of approximately 120 Kohms and includes a first terminal 149 connected to base electrode 135 of third BJT $Q_{103}$ and a second terminal 151 connected to ground terminal 115. It should be noted that fourth resistor $R_{104}$ is required because first BJT $Q_{101}$, second BJT $Q_{102}$ and third BJT $Q_{103}$ are identical. However, if first BJT $Q_{101}$, second BJT $Q_{102}$ and third BJT $Q_{103}$ had unequal turn-on threshold voltage values which would result in second BJT $Q_{102}$ turning on before first BJT $Q_{101}$ and third BJT $Q_{103}$ during use, fourth resistor $R_{104}$ could be eliminated from switch 111 without departing from the spirit of the present invention.

Output terminal 117 can be connected through a load resistor $R_L$ to a supply voltage $V_{CC}$, load resistor $R_L$ preferably having a value of 1.0 Kohms. As can be appreciated, both load resistor $R_L$ and supply voltage $V_{CC}$ are external to switch 111 and consequently are not to be considered part of the present invention.

Switch 111 further comprises a fifth resistor $R_{105}$. Fifth resistor $R_{105}$ preferably has a value of approximately 1.0 Mohms and includes a first terminal 153 connected to base electrode 135 of third BJT $Q_{103}$ and a second terminal 155 connected to base electrode 123 of first BJT $Q_{101}$. However, it should be noted that if the current flowing into base electrode 123 of first BJT $Q_{101}$ does not reduce the amount of current available to drive base electrode 135 of third BJT $Q_{103}$ to less current than is needed for third BJT $Q_{103}$ to switch the load current through load resistor $R_L$ and thus ensure proper operation of switch 111, fifth resistor $R_{105}$ could alternatively have a value of zero ohms without departing from the spirit of the present invention. If fifth resistor $R_{105}$ has a value of zero ohms, first terminal 153 and second terminal 155 are connected together.

It should be noted that an additional device, such as a diode, PNP bipolar transistor, P-channel FET, or programmable unijunction transistor (PUT), could optionally be connected to input terminal 113 and base electrode 135 in parallel with second resistor $R_{102}$ without departing from the spirit of the present invention. As can be appreciated, the device would serve to assist in removing charge from base electrode 135 of third BJT $Q_{103}$.

In use, switch 111 functions in a similar manner to switch 11. In particular, switch 111 similarly has a rising threshold voltage which is significantly higher than its falling threshold voltage, as shown in FIG. 5. As a result, a noisy input signal will not cause switch 111 to experience unwanted state changes, which is desirable.

Figure 6:
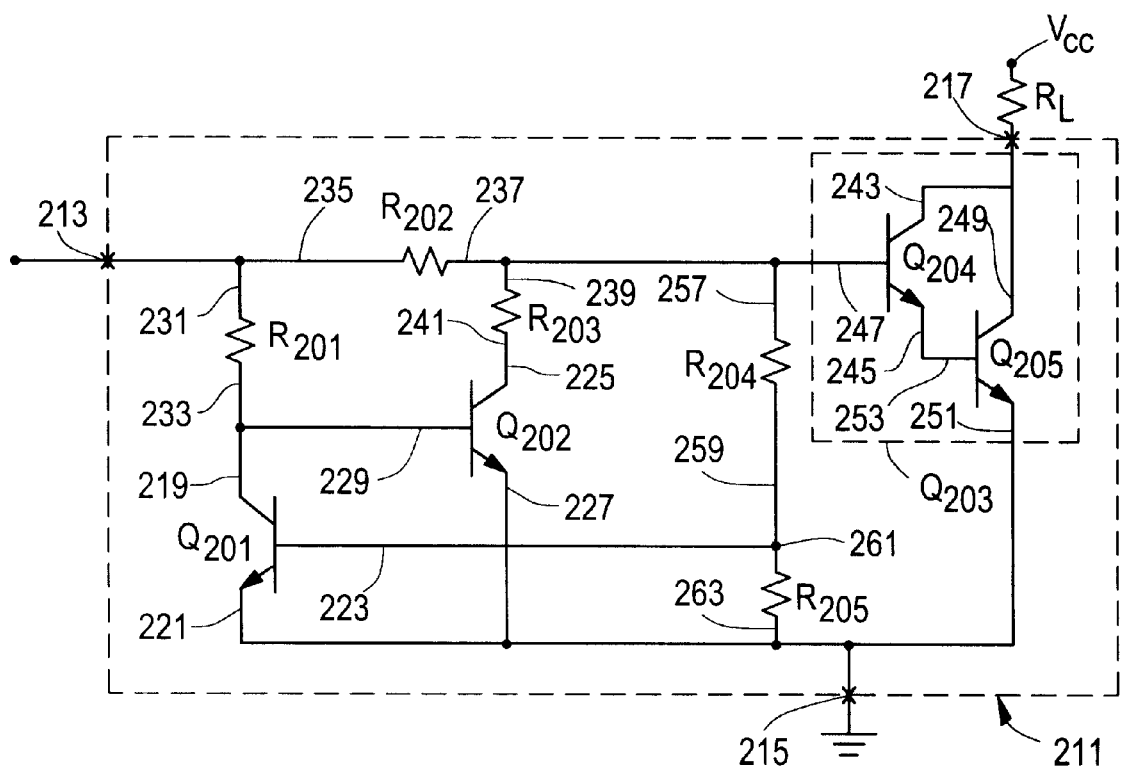
FIG. 6 is a schematic representation of a third embodiment of a three-terminal inverting hysteretic transistor switch constructed according to the teachings of the present invention, the switch being shown with an external load.

Referring now to FIG. 6, there is shown a third embodiment of a three-terminal inverting hysteretic transistor switch constructed according to the teachings of the present invention, the switch being identified as reference numeral 211. Switch 211 is similar to switch 111 in that switch 211 is also inverting, experiences input signal actuated hysteresis and comprises only three terminals.

Switch 211 is similar to switch 111 in that switch 211 comprises an input terminal 213, a ground terminal 215 and an output terminal 217. As can be appreciated, input terminal 213, ground terminal 215 and output terminal 217 are the only terminals for switch 211, which is an object of the present invention.

Switch 211 is similar to switch 111 in that switch 211 comprises a first bipolar junction transistor (BJT) $Q_{201}$ and a second bipolar junction transistor (BJT) $Q_{202}$ which are identical in construction with first BJT $Q_{101}$ and second BJT $Q_{102}$ of switch 111. Preferably, first BJT $Q_{201}$ and second BJT $Q_{202}$ are both NPN 2N2222-type bipolar junction transistors, each preferably having a BJT threshold voltage $V_{BJTTH}$ of approximately 0.7 volts. However, it is to be understood that first BJT $Q_{201}$ and second BJT $Q_{202}$ are not limited to having a threshold voltage of approximately 0.7 volts. In addition, it is to be understood that first BJT $Q_{201}$ and second BJT $Q_{202}$ are not limited to having equal threshold voltages. Rather, it is to be understood that first BJT $Q_{201}$ and second BJT $Q_{202}$ could each have different threshold voltage values from one another without departing from the spirit of the present invention.

First BJT $Q_{201}$ includes a collector electrode 219, an emitter electrode 221 connected to ground terminal 215 and a base electrode 223. Second BJT $Q_{202}$ includes a collector electrode 225, an emitter electrode 227 connected to ground terminal 215 and a base electrode 229 connected to collector electrode 219 of first BJT $Q_{201}$.

Switch 211 also comprises a first resistor $R_{201}$, a second resistor $R_{202}$ and a third resistor $R_{203}$. First resistor $R_{201}$ preferably has a value of approximately 1.0 Mohms and includes a first terminal 231 connected to input terminal 213 and a second terminal 233 connected to collector electrode 219 of first BJT $Q_{201}$. Second resistor $R_{202}$ preferably has a value of approximately 120 Kohms and includes a first terminal 235 connected to input terminal 213 and a second terminal 237. Third resistor $R_{203}$ preferably has a value of approximately 1.0 Mohms and includes a first terminal 239 connected to second terminal 237 of second resistor $R_{202}$ and a second terminal 241 connected to collector electrode 225 of second BJT $Q_{202}$.

The principle distinction between switch 211 and switch 111 is that switch 211 comprises a Darlington-connected compound bipolar junction transistor $Q_{203}$ in place of third BJT $Q_{103}$ of switch 111. Darlington-connected compound BJT $Q_{203}$ is desirable in that it has twice the turn-on threshold voltage of either first BJT $Q_{201}$ or second BJT $Q_{202}$. As a consequence, no resistor is required in switch 211 to perform the function performed by fourth resistor $R_{104}$ in switch 111. Darlington-connected compound BJT $Q_{203}$ is also desirable because it can switch relatively high current and voltage with small die area.

Darlington-connected compound BJT $Q_{203}$ comprises a fourth BJT $Q_{204}$ and a fifth BJT $Q_{205}$. Preferably, fourth BJT $Q_{204}$ and fifth BJT $Q_{205}$ are both NPN TIP121-type bipolar junction transistors, each preferably having a BJT threshold voltage $V_{BJTTH}$ of approximately 1.4 volts or approximately two times the voltage of the threshold voltage of first BJT $Q_{201}$ and second BJT $Q_{202}$.

Fourth BJT $Q_{204}$ includes a collector electrode 243 connected to output terminal 217, an emitter electrode 245 and a base electrode 247 connected to second terminal 237 of second resistor $R_{202}$. Fifth BJT $Q_{205}$ includes a collector electrode 249 connected to output terminal 217, an emitter electrode 251 connected to ground terminal 215 and a base electrode 253 connected to emitter electrode 245 of fourth BJT $Q_{204}$.

Switch 111 additionally comprises a fourth resistor $R_{204}$ and a fifth resistor $R_{205}$ which together act as a resistor divider for increasing the effective turn-on voltage threshold of first BJT $Q_{201}$. Fourth resistor $R_{204}$ preferably has a value of approximately 1.0 Mohms and includes a first terminal 257 connected to base electrode 247 of fourth BJT $Q_{204}$ and a second terminal 259 connected to base electrode 223 of first BJT $Q_{201}$. Fifth resistor $R_{205}$ preferably has a value of approximately 1.0 Mohms and includes a first terminal 261 connected to second terminal 259 of fourth resistor $R_{204}$ and a second terminal 263 connected to ground terminal 215.

Output terminal 217 can be connected through a load resistor $R_L$ to a supply voltage $V_{CC}$, load resistor $R_L$ preferably having a value of 1.0 Kohms. As can be appreciated, both load resistor $R_L$ and supply voltage $V_{CC}$ are external to switch 211 and consequently are not to be considered part of the present invention.

It should be noted that an additional device, such as a diode, PNP bipolar transistor, P-channel FET, or programmable unijunction transistor (PUT), could optionally be connected to input terminal 213 and base electrode 247 in parallel with second resistor $R_{202}$ without departing from the spirit of the present invention. As can be appreciated, the device would serve to assist in removing charge from base electrode 247 of fourth BJT $Q_{204}$.

In use, switch 211 functions in a similar manner to switch 111. In particular, switch 211 similarly has a rising threshold voltage which is significantly higher than its falling threshold voltage. As a result, a noisy input signal will not cause switch 211 to experience unwanted state changes, which is desirable.

Figure 7:
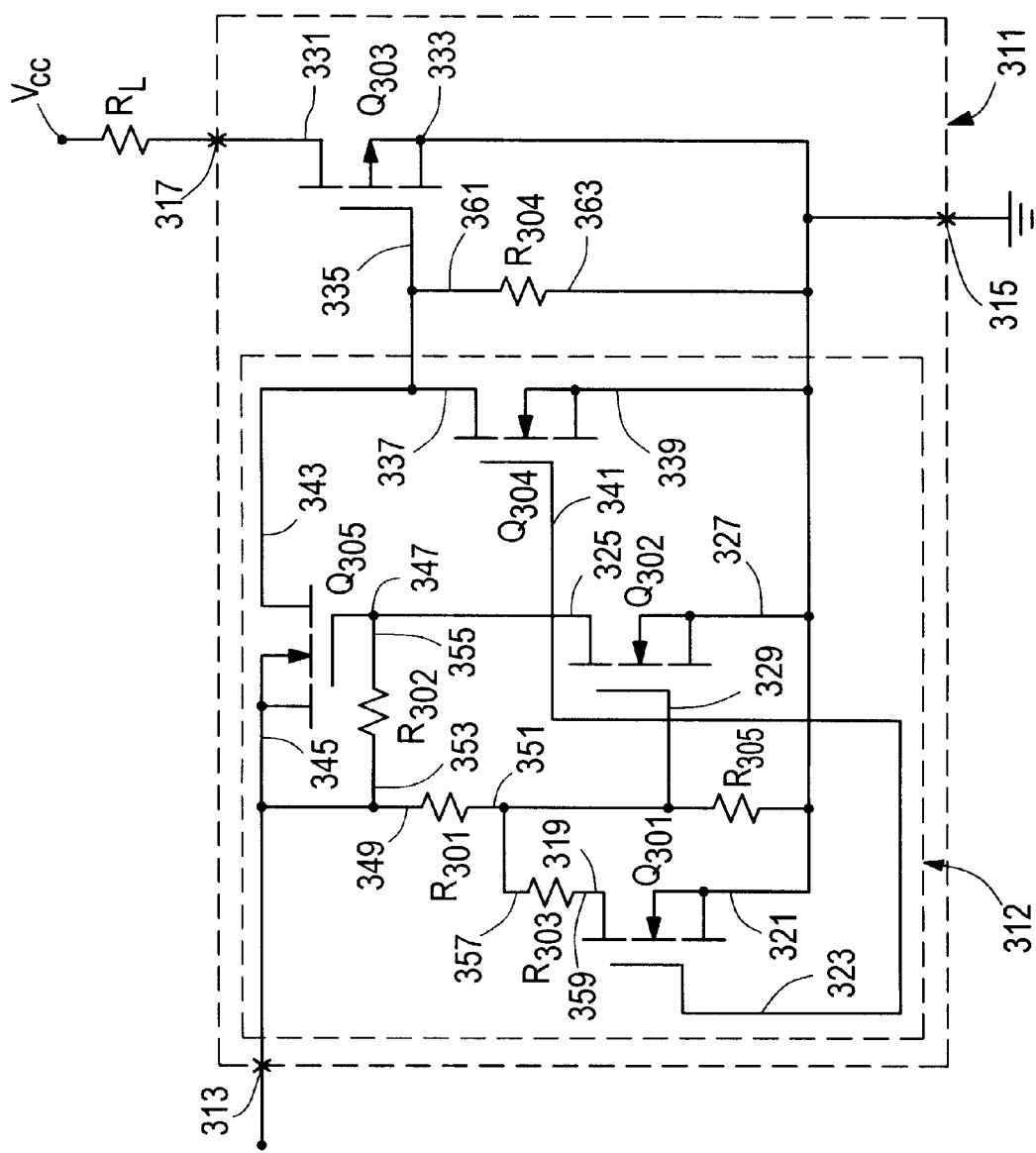
FIG. 7 is a schematic representation of a fourth embodiment of a three-terminal inverting hysteretic transistor switch constructed according to the teachings of the present invention, the switch being shown with an external load.

Referring now to FIG. 7, there is shown a fourth embodiment of a three-terminal inverting hysteretic transistor switch constructed according to the teachings of the present invention, the switch being identified as reference numeral 311. Switch 311 is similar to switch 11 in that switch 311 is also inverting, experiences input signal actuated hysteresis and comprises only three terminals.

Switch 311 comprises an input terminal 313, a ground terminal 315 and an output terminal 317. As can be appreciated, input terminal 313, ground terminal 315 and output terminal 317 are the only terminals for switch 311, which is an object of the present invention.

Switch 311 differs principally from switch 11 in that switch 311 comprises a hysteresis circuit 312 which differs in construction from hysteresis circuit 12, as will be described further in detail below.

Switch 311 comprises a first MOSFET $Q_{301}$, a second MOSFET $Q_{302}$, a third MOSFET $Q_{303}$, a fourth MOSFET $Q_{304}$ and a fifth MOSFET $Q_{305}$. First MOSFET $Q_{301}$, second MOSFET $Q_{302}$, third MOSFET $Q_{303}$ and fourth MOSFET $Q_{304}$ are all preferably N-channel, enhancement-mode MOSFETs, each preferably having a MOSFET threshold voltage $V_{FETTH}$ of approximately 1.2 volts. Fifth MOSFET $Q_{305}$ is preferably a P-channel enhancement-mode MOSFET having a MOSFET threshold voltage $V_{FETTH}$ of approximately 1.2 volts. However, it is to be understood that first MOSFET $Q_{301}$, second MOSFET $Q_{302}$, third MOSFET $Q_{303}$, fourth MOSFET $Q_{304}$ and fifth MOSFET $Q_{305}$ are not limited to having a threshold voltage of approximately 1.2 volts. In addition, it is to be understood that first MOSFET $Q_{301}$, second MOSFET $Q_{302}$, third MOSFET $Q_{303}$, fourth MOSFET $Q_{304}$ and fifth MOSFET $Q_{305}$ are not limited to having equal threshold voltages. Rather, it is to be understood that first MOSFET $Q_{301}$, second MOSFET $Q_{302}$, third MOSFET $Q_{303}$, fourth MOSFET $Q_{304}$ and fifth MOSFET $Q_{305}$ could each have different threshold voltage values from one another without departing from the spirit of the present invention.

First MOSFET $Q_{301}$ includes a drain electrode 319, a source electrode 321 connected to ground terminal 315 and a gate electrode 323. Second MOSFET $Q_{302}$ includes a drain electrode 325, a source electrode 327 connected to ground terminal 315 and a gate electrode 329. Third MOSFET $Q_{303}$ includes a drain electrode 331 connected to output terminal 317, a source electrode 333 connected to ground terminal 315 and a gate electrode 335. Fourth MOSFET $Q_{304}$ includes a drain electrode 337 connected to gate electrode 335 of third MOSFET $Q_{303}$, a source electrode 339 connected to ground terminal 315 and a gate electrode 341 connected to gate electrode 323 of first MOSFET $Q_{301}$. Fifth MOSFET $Q_{305}$ includes a drain electrode 343 connected to gate electrode 335 of third MOSFET $Q_{303}$, a source electrode 345 connected to input terminal 313 and a gate electrode 347 connected to drain electrode 325 of second MOSFET $Q_{302}$.

Switch 311 further comprises a first resistor $R_{301}$, a second resistor $R_{302}$ and a third resistor $R_{303}$. First resistor $R_{301}$ preferably has a value of approximately 1.0 Mohms and includes a first terminal 349 connected to input terminal 313 and a second terminal 351 connected to gate electrode 329 of second MOSFET $Q_2$. Second resistor $R_{302}$ preferably has a value of approximately 1.0 Mohms and includes a first terminal 353 connected to input terminal 313 and a second terminal 355 connected to gate electrode 347 of fifth MOSFET $Q_{305}$. Third resistor $R_{303}$ preferably has a value of approximately 1.0 Mohms and includes a first terminal 357 connected to gate electrode 329 of second MOSFET $Q_{302}$ and a second terminal 359 connected to drain electrode 359 of first MOSFET $Q_{301}$.

Switch 311 additionally comprises a fourth resistor $R_{304}$. Fourth resistor $R_{304}$ preferably has a value of approximately 1.0 Mohms and includes a first terminal 361 connected to gate electrode 335 of third MOSFET $Q_{303}$ and a second terminal 363 connected to ground terminal 315. It should be noted that fourth resistor $R_{304}$ is not essential to the function of switch 311 and accordingly, could be removed without departing from the spirit of the present invention. However, removal of fourth resistor $R_{304}$ is not preferred because removal of fourth resistor $R_{304}$ may degrade the capability of third MOSFET $Q_{303}$ to turn off in some situations.

Output terminal 317 can be connected through a load resistor $R_L$ to a supply voltage $V_{cc}$, load resistor $R_L$ preferably having a value of 1.0 Kohms. As can be appreciated, both load resistor $R_L$ and supply voltage $V_{cc}$ are external to switch 311 and consequently are not to be considered part of the present invention.

It should be noted that an additional device, such as a diode, PNP bipolar transistor, P-channel FET, or programmable unijunction transistor (PUT), could optionally be connected to input terminal 313 and drain electrode 343 of fifth MOSFET $Q_{305}$ without departing from the spirit of the present invention. As can be appreciated, the device would serve to assist in removing charge from gate electrode 335 of third MOSFET $Q_{303}$.

In use, switch 311 functions similarly to switch 11. Specifically, third MOSFET $Q_{303}$ acts as the output switch for switch 311. Together, first MOSFET $Q_{301}$, second MOSFET $Q_{302}$, fourth MOSFET $Q_{304}$, fifth MOSFET $Q_{305}$, first resistor $R_{301}$, second resistor $R_{302}$, third resistor $R_{303}$ and fifth resistor $R_{305}$ form hysteresis circuit 312 for third MOSFET $Q_{303}$. Hysteresis circuit 312 provides a high threshold voltage to gate electrode 335, commonly referred to as the rising or positive threshold voltage, to switch third MOSFET $Q_{303}$ on during low-to-high input signal transitions and a lower threshold voltage to gate electrode 335, commonly referred to as the falling or negative threshold voltage, to switch third MOSFET $Q_{303}$ off during high-to-low input signal transitions. Because switch 311 has a rising threshold voltage which is significantly higher than its falling threshold voltage, a noisy input signal will not cause switch 311 to experience unwanted state changes, which is desirable.

It should be noted that, due to its complex arrangement, hysteresis circuit 312 is a higher performance circuit than hysteresis circuit 12 of switch 11. Specifically, hysteresis circuit 312 is preferable because hysteresis circuit 312 improves the turn-off of third MOSFET $Q_{303}$ through the gate charge path and because hysteresis circuit 312 enables nearly the entire input voltage $V_{in}$ to be applied directly to third MOSFET $Q_{303}$.

Figure 8:
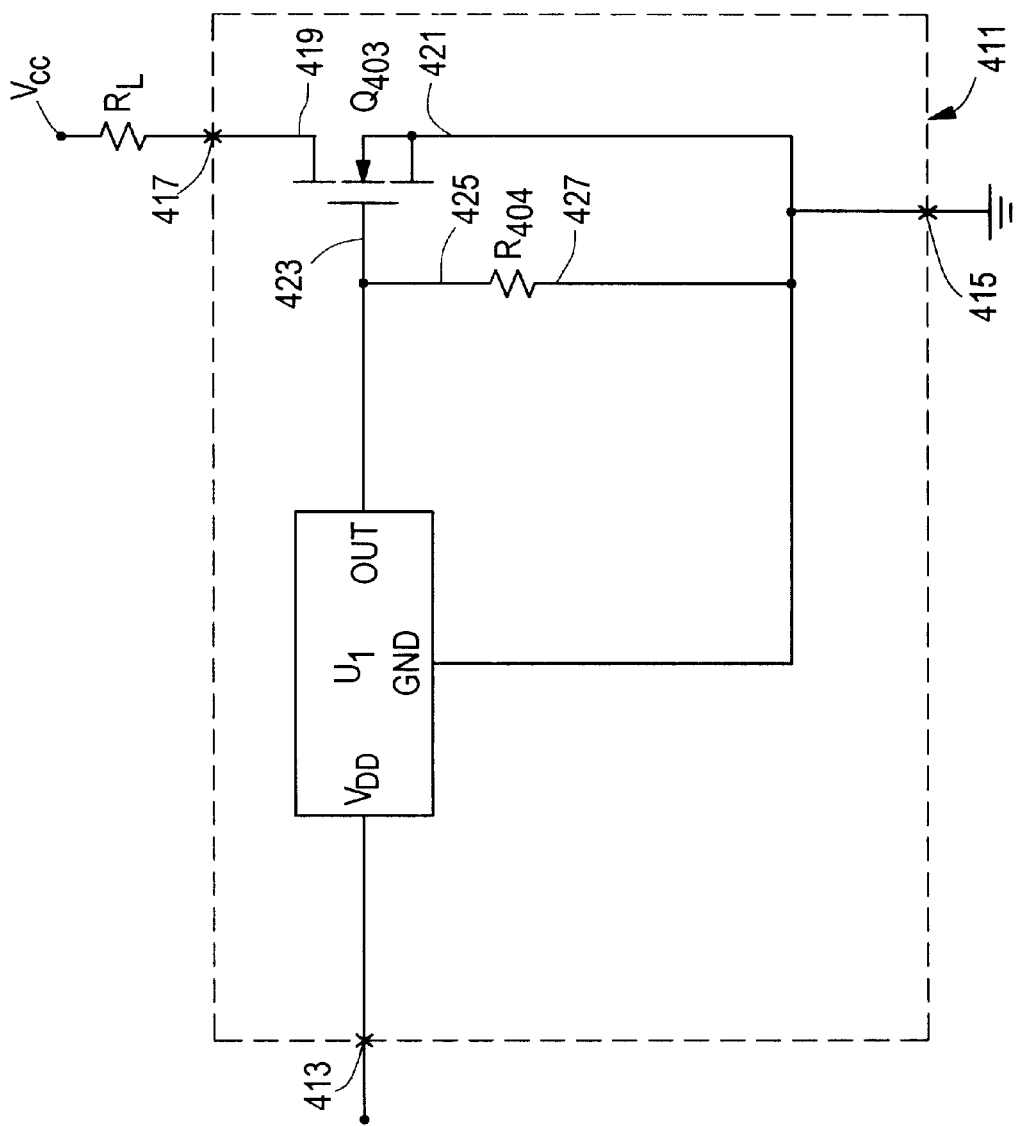
FIG. 8 is a schematic representation of a fifth embodiment of a three-terminal inverting hysteretic transistor switch constructed according to the teachings of the present invention, the switch being shown with an external load.

Referring now to FIG. 8, there is shown a fifth embodiment of a three-terminal inverting hysteretic transistor switch constructed according to the teachings of the present invention, the switch being identified as reference numeral 411. Switch 411 is similar to switch 311 in that switch 411 is also inverting, experiences input signal actuated hysteresis and comprises only three terminals.

Switch 411 is similar to switch 311 in that switch 411 comprises an input terminal 413, a ground terminal 415 and an output terminal 417. As can be appreciated, input terminal 413, ground terminal 415 and output terminal 417 are the only terminals for switch 411, which is an object of the present invention.

Switch 411 differs principally from switch 311 in that switch 411 comprises an integrated circuit (IC) chip $U_1$ in place of hysteresis circuit 312.

IC chip $U_1$ is a voltage detector CMOS IC chip, such as Panasonic IC chip, model MN13812(G), or Motorola IC chip, model MC33464-XX. IC chip $U_1$ includes a input voltage pin $V_{DD}$ which is connected to input terminal 413, a ground pin GND which is connected to ground terminal 415 and an output pin OUT.

Switch 411 comprises a MOSFET $Q_{403}$ which is preferably an N-channel, enhancement-mode, VN2222LL-model MOSFET. MOSFET $Q_{403}$ includes a drain electrode 419 connected to output terminal 417, a source electrode 421 connected to ground terminal 415 and a gate electrode 423 connected to output pin OUT of IC chip $U_1$.

Switch additionally comprises a resistor $R_{404}$ which preferably has a value of approximately 1.0 Mohms and includes a first terminal 425 connected to gate electrode 423 of MOSFET $Q_{403}$ and a second terminal 427 connected to ground terminal 415. It should be noted that fourth resistor $R_{404}$ is not essential to the function of switch 411 and accordingly, could be removed without departing from the spirit of the present invention; However, removal of fourth resistor $R_{404}$ is not preferred because removal of fourth resistor $R_{404}$ may degrade the capability of MOSFET $Q_{403}$ to turn off in some situations.

Output terminal 417 can be connected through a load resistor $R_L$ to a supply voltage $V_{CC}$, load resistor $R_L$ preferably having a value of 1.0 Kohms. As can be appreciated, both load resistor $R_L$ and supply voltage $V_{CC}$ are external to switch 411 and consequently are not to be considered part of the present invention.

It should be noted that an additional device, such as a diode, PNP bipolar transistor, P-channel FET, or programmable unijunction transistor (PUT), could optionally be connected to input terminal 413 and gate electrode 423 without departing from the spirit of the present invention. As can be appreciated, the device would serve to assist in removing charge from gate electrode 423 of MOSFET $Q_{403}$.

In use, switch 411 functions in a similar manner to switch 311. In particular, switch 411 similarly has a rising threshold voltage which is significantly higher than its falling threshold voltage. As a result, a noisy input signal will not cause switch 411 to experience unwanted state changes, which is desirable.

Figure 9:
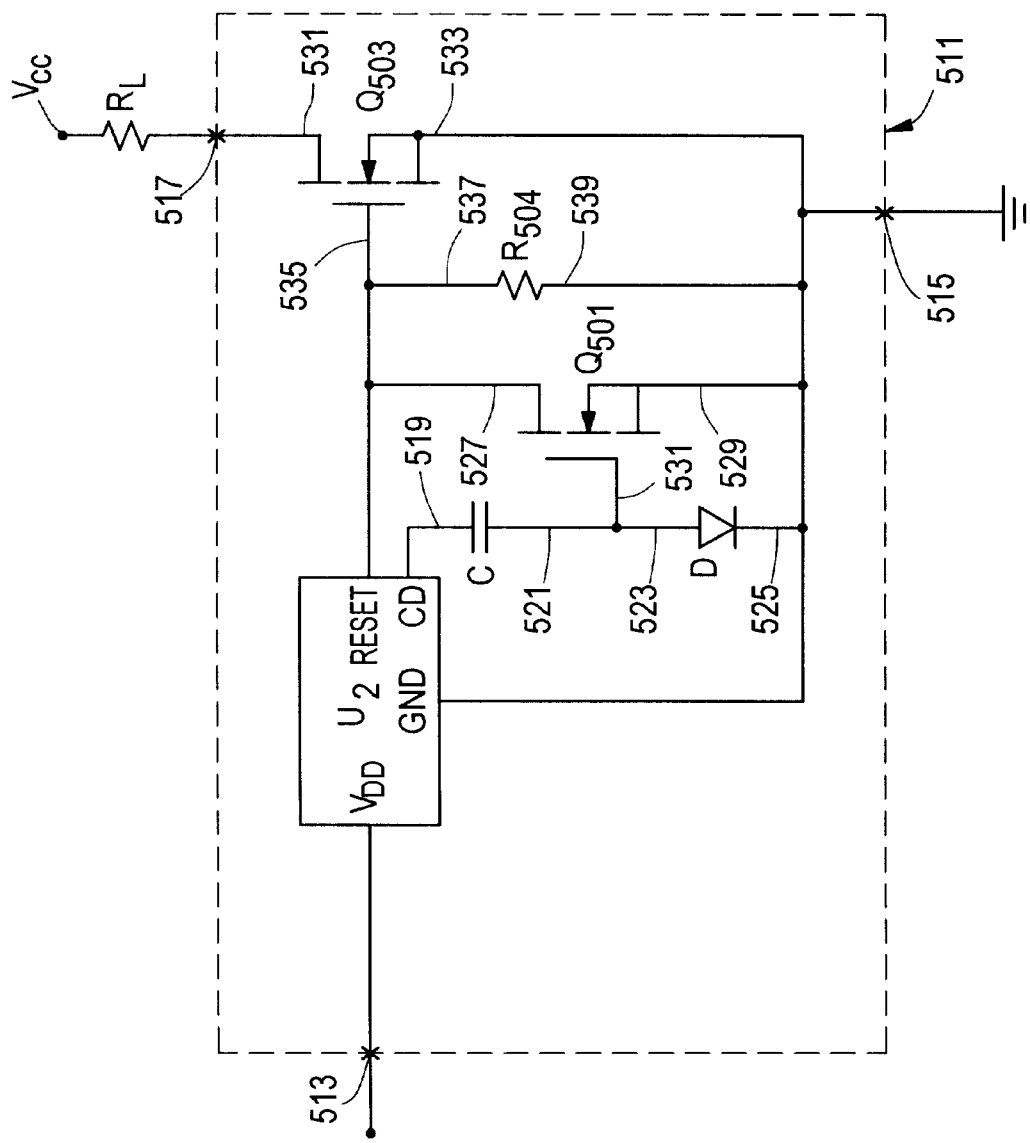
FIG. 9 is a schematic representation of a sixth embodiment of a three-terminal inverting hysteretic transistor switch constructed according to the teachings of the present invention, the switch being shown with an external load.

Referring now to FIG. 9, there is shown a sixth embodiment of a three-terminal inverting hysteretic transistor switch constructed according to the teachings of the present invention, the switch being identified as reference numeral 511. Switch 511 is similar to switch 311 in that switch 511 is also inverting, experiences input signal actuated hysteresis and comprises only three terminals.

Switch 511 is similar to switch 311 in that switch 511 comprises an input terminal 513, a ground terminal 515 and an output terminal 517. As can be appreciated, input terminal 513, ground terminal 515 and output terminal 517 are the only terminals for switch 511, which is an object of the present invention.

Switch 511 differs principally from switch 311 in that switch 511 comprises an integrated circuit (IC) chip $U_2$, a capacitor C, a diode D, and a first MOSFET $Q_{501}$ in place of hysteresis circuit 312.

IC chip $U_2$ is a voltage detector CMOS IC chip, such as Motorola IC chip, model MC33465-XX. IC chip $U_2$ includes a input voltage pin $V_{DD}$ which is connected to input terminal 513, a ground pin GND which is connected to ground terminal 415, a reset pin RESET and an output pin CD.

Capacitor C is preferably a 1000 pF capacitor and includes a first terminal 519 connected to output pin CD of IC chip $U_2$ and a second terminal 521. Diode D includes a first terminal 523 connected to second terminal 521 of capacitor C and a second terminal 525 connected to ground terminal 515.

First MOSFET $Q_{501}$ is preferably an N-channel, depletion-mode MOSFET and includes a drain electrode 527 connected to reset pin RESET of IC chip $U_2$, a source electrode 529 connected to ground terminal 515 and a gate electrode 531 connected to second terminal 521 of capacitor C.

Switch 511 further comprises a second MOSFET $Q_{503}$ is preferably an N-channel, enhancement-mode, VN2222LL-model MOSFET. MOSFET $Q_{503}$ includes a drain electrode 531 connected to output terminal 517, a source electrode 533 connected to ground terminal 515 and a gate electrode 535 connected to reset pin RESET of IC chip $U_2$.

Switch 511 additionally comprises a resistor $R_{504}$ which preferably has a value of approximately 1.0 Mohms and includes a first terminal 537 connected to gate electrode 535 of second MOSFET $Q_{503}$ and a second terminal 539 connected to ground terminal 515. It should be noted that resistor $R_{504}$ is not essential to the function of switch 511 and accordingly, could be removed without departing from the spirit of the present invention; However, removal of resistor $R_{504}$ is not preferred because removal of resistor $R_{504}$ may degrade the capability of second MOSFET $Q_{503}$ to turn off in some situations.

Output terminal 517 can be connected through a load resistor $R_L$ to a supply voltage $V_{CC}$, load resistor $R_L$ preferably having a value of 1.0 Kohms. As can be appreciated, both load resistor $R_L$ and supply voltage $V_{CC}$ are external to switch 511 and consequently are not to be considered part of the present invention.

It should be noted that an additional device, such as a diode, PNP bipolar transistor, P-channel FET, or programmable unijunction transistor (PUT), could optionally be connected to input terminal 513 and gate electrode 535 without departing from the spirit of the present invention. As can be appreciated, the device would serve to assist in removing charge from gate electrode 535 of second MOSFET $Q_{503}$.

In use, switch 511 functions in a similar manner to switch 311. In particular, switch 511 similarly has a rising threshold voltage which is significantly higher than its falling threshold voltage. As a result, a noisy input signal will not cause switch 511 to experience unwanted state conditions, which is desirable.

Throughout this application, it should be noted that the words "electrode" and "terminal" are interchangeable.

The embodiments of the present invention described above are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. An inverting hysteretic transistor switch having only three terminals, said three terminals being an input terminal, an output terminal and a ground terminal, said inverting hysteretic transistor switch comprising:

a. a first field effect transistor (FET) having a drain terminal, a source terminal and a gate terminal, the source terminal of said first FET being connected to the ground terminal;

b. a second field effect transistor (FET) having a drain terminal, a source terminal and a gate terminal, the source terminal of said second FET being connected to the ground terminal and the gate terminal of said second FET being connected to the drain terminal of said first FET;

c. a third field effect transistor (FET) having a drain terminal, a source terminal and a gate terminal, the source terminal of said third FET being connected to the ground terminal, the drain terminal of said third FET being connected to the output terminal and the gate terminal of said third FET being connected to the gate terminal of said first FET;

d. a first resistor having a first terminal and a second terminal, the first terminal of said first resistor being connected to the input terminal and the second terminal of said first resistor being connected to the drain terminal of said first FET;

e. a second resistor having a first terminal and a second terminal, the first terminal of said second resistor being connected to the input terminal and the second terminal of said second resistor being connected to the gate terminal of said first FET; and f. a third resistor having a first terminal and a second terminal, the first terminal of said third resistor is connected to the gate terminal of said first FET and the second terminal of said third resistor is connected to the drain terminal of said second FET.

2. The inverting hysteretic transistor switch of claim 1 wherein each of said first, second and third field effect transistors are N-channel, enhancement-mode, metal-oxide semiconductor field effect transistors (MOSFETs).

3. The inverting hysteretic transistor switch of claim 2 wherein said first, second and third field effect transistors (FETs) have equal threshold voltages.

4. The inverting hysteretic transistor switch of claim 3 wherein said first, second and third resistors are approximately 120 Kohms.

5. The inverting hysteretic transistor switch of claim 4 further comprising a fourth resistor having a first terminal and a second terminal, the first terminal of said fourth resistor being connected to the gate terminal of said third FET and the second terminal of said fourth resistor being connected to ground.

6. An inverting hysteretic transistor switch having only three terminals, said three terminals being an input terminal, an output terminal and a ground terminal, said inverting hysteretic transistor switch comprising:
   a. a first transistor having a collector electrode, a base electrode and an emitter electrode connected to the ground terminal;
   b. a second transistor having a collector electrode, a base electrode connected to the collector electrode of said first transistor and an emitter electrode connected to the ground terminal;
   c. a third transistor having a collector electrode connected to the output terminal, a base electrode connected to the base electrode of said first transistor and an emitter electrode connected to the ground terminal;
   d. a first resistor having a first terminal connected to the input terminal and a second terminal connected to the collector electrode of said first transistor;
   e. a second resistor having a first terminal connected to the input terminal and a second terminal connected to the base electrode of said third transistor; and
   f. a third resistor having a first terminal connected to the base electrode of said third transistor and a second terminal connected to the collector electrode of said second transistor.

7. The inverting hysteretic transistor switch of claim 6 wherein said third transistor is a Darlington-connected compound bipolar junction transistor.

8. The inverting hysteretic transistor switch of claim 7 wherein the base electrode of said third transistor is connected to the base electrode of said first transistor through a fourth resistor having a first terminal connected to the base electrode of said third transistor and a second terminal connected to the base electrode of said first transistor.

9. The inverting hysteretic transistor switch of claim 8 further comprising a fifth resistor having a first terminal connected to the second terminal of said fourth resistor and a second terminal connected to the ground terminal.

10. The inverting hysteretic transistor switch of claim 6 wherein each of said first, second and third transistors are NPN bipolar junction transistors (BJTs).

11. An inverting hysteretic transistor switch having only three terminals, said three terminals being an input terminal, an output terminal and a ground terminal, said inverting hysteretic transistor switch comprising:
   a. a first field effect transistor (FET) having a drain electrode, a source electrode and a gate electrode, the source electrode of said first FET being connected to the ground terminal;
   b. a second field effect transistor (FET) having a drain electrode, a source electrode and a gate electrode, the source electrode of said second FET being connected to the ground terminal;
   c. a third field effect transistor (FET) having a drain electrode, a source electrode and a gate electrode, the source electrode of said third FET being connected to the ground terminal, the drain electrode of said third FET being connected to the output terminal;
   d. a fourth field effect transistor (FET) having a drain electrode, a source electrode and a gate electrode, the source electrode of said fourth FET being connected to the ground terminal, the drain electrode of said fourth FET being connected to the gate electrode of said third FET, the gate electrode of said fourth FET being connected to the gate electrode of said first FET;
   e. a fifth field effect transistor (FET) having a drain electrode, a source electrode and a gate electrode, the source electrode of said fifth FET being connected to the input terminal, the drain electrode of said fifth FET being connected to the gate electrode of said third FET, the gate electrode of said fifth FET being connected to the drain electrode of said second FET;
   f. a first resistor having a first terminal and a second terminal, the first terminal of said first resistor being connected to the input terminal and the second terminal of said first resistor being connected to the gate electrode of said second PET;
   g. a second resistor having a first terminal and a second terminal, the first terminal of said second resistor being connected to the input terminal and the second terminal of said second resistor being connected to the gate electrode of said fifth FET; and
   h. a third resistor having a first terminal and a second terminal, the first terminal of said third resistor is connected to the gate electrode of said second FET and the second terminal of said third resistor is connected to the drain electrode of said first FET.

12. The inverting hysteretic transistor switch of claim 11 further comprising a fourth resistor having a first terminal and a second terminal, the first terminal of said fourth resistor being connected to the gate electrode of said third FET and the second terminal of said fourth resistor being connected to the ground terminal.

* * * * *